United States Patent
Wong et al.

(10) Patent No.: US 7,710,094 B1
(45) Date of Patent: May 4, 2010

(54) CURRENT-MODE-CONTROLLED CURRENT SENSOR CIRCUIT FOR POWER SWITCHING CONVERTER

(75) Inventors: Yat To William Wong, Hong Kong (HK); Xiao Fei Kuang, Shenzhen (CN); Kam Chuen Wan, Hong Kong (HK); Kwok Kuen David Kwong, Davis, CA (US)

(73) Assignee: Hong Kong Applied Science and Technology Research Institute Co., Ltd., Hong Kong (HK)

( * ) Notice: Subject to any disclaimer, the term of this patent is extended or adjusted under 35 U.S.C. 154(b) by 5 days.

(21) Appl. No.: 12/333,979

(22) Filed: Dec. 12, 2008

(51) Int. Cl.
*G05F 1/00* (2006.01)
*G05F 3/02* (2006.01)
*G05F 3/16* (2006.01)
(52) U.S. Cl. .................. 323/285; 323/225; 323/284; 327/541
(58) Field of Classification Search ......... 323/272–281, 323/282–290, 291, 222, 225; 327/541, 543
See application file for complete search history.

(56) References Cited

U.S. PATENT DOCUMENTS

| | | | |
|---|---|---|---|
| 5,757,174 A | | 5/1998 | Ki |
| 6,600,362 B1 * | | 7/2003 | Gavrila ..................... 327/541 |
| 7,034,542 B2 * | | 4/2006 | Peterson ..................... 324/522 |
| 7,205,771 B2 * | | 4/2007 | Berton ..................... 324/522 |
| 7,301,347 B2 | | 11/2007 | Dearn et al. |

OTHER PUBLICATIONS

Steele, Extending Voltage Range of Current Shunt Monitor, Texas Instruments Application Report SLLA 190, Feb. 2006.
Lee & Mok, A Monolithic current-Mode CMOS DC-DC Converter With On-Chip Current-Sensing Technique, IEEE J.S.S.C., vol. 39, No. 1, Jan. 2004.
Lam, Ki, & Ma, Loop Gain Analysis and Development of High-Speed High-Accuracy Current Sensors for Switching Converters, Circuits and Systems, 2004, ISCAS'04, V828-V831, 2004.

* cited by examiner

*Primary Examiner*—Jessica Han
*Assistant Examiner*—Emily Pham
(74) *Attorney, Agent, or Firm*—Stuart T. Auvinen; gPatent LLC

(57) ABSTRACT

A power converter has a power transistor driving a power current through an inductor to provide a controlled power-supply voltage. The power transistor is on during a first state but off during a second state when a sink transistor reduces the power current through the inductor. Both voltage sensing of the power-supply voltage and current sensing at the power transistor provide feedback to control the amount of time that the first state is active, and thus control the power current. Current sensing is provided by a smaller minor transistor in parallel with the power transistor. The minor transistor turns on after the power transistor to reduce disturbance spikes. Switches connect sources of the power and mirror transistors to an amplifier that drives a sensing transistor. The sensing transistor generates a sensing voltage from the mirror transistor source. During the second state the amplifier's inputs are equalized to provide fast response.

20 Claims, 9 Drawing Sheets

STATE S1

CURRENT-MODE-CONTROLLED CURRENT SENSOR CIRCUIT FOR POWER SWITCHING CONVERTER

FIELD OF THE INVENTION

This invention relates to monolithic current sensors, and more particularly to sensing and controlling current across a power transistor.

BACKGROUND OF THE INVENTION

Many portable devices and electronic systems require a stable power supply. Devices may be sensitive to variations in the power-supply voltage, so providing a stable power-supply voltage is critical. However, the device may draw varying amounts of current from the power supply as internal transistors are switched on and off. Such current variations make providing a constant power-supply voltage difficult. When large amounts of current are suddenly sunk by the device, the power-supply voltage can drop to dangerously low levels that may cause storage upsets or logical failures.

A monolithic power converter chip or block in a larger system may have a large power transistor may be used to drive current through an inductor. The inductor smoothes changes in the large current provided by the power transistor, and additional filter capacitors store charge to help stabilize the power-supply voltage. However, the power transistor needs to be turned on and off to restore charge on the filter capacitors and thus maintain the desired power-supply voltage.

The power-supply voltage may be sensed and compared to a target voltage. However, measuring the current through the power transistor or inductor can provide more rapid feedback and better control of the power-supply current. Having multiple sources of feedback, such as both the power-supply voltage and the power current can provide extremely fast response times, such as responses in micro-seconds rather than just milli-seconds.

What is desired is a power-current sensor and control circuit. A power control circuit is desired that can quickly sense power current and adjust a power transistor to maintain a stable power supply.

DETAILED DESCRIPTION

The present invention relates to an improvement in power converters. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
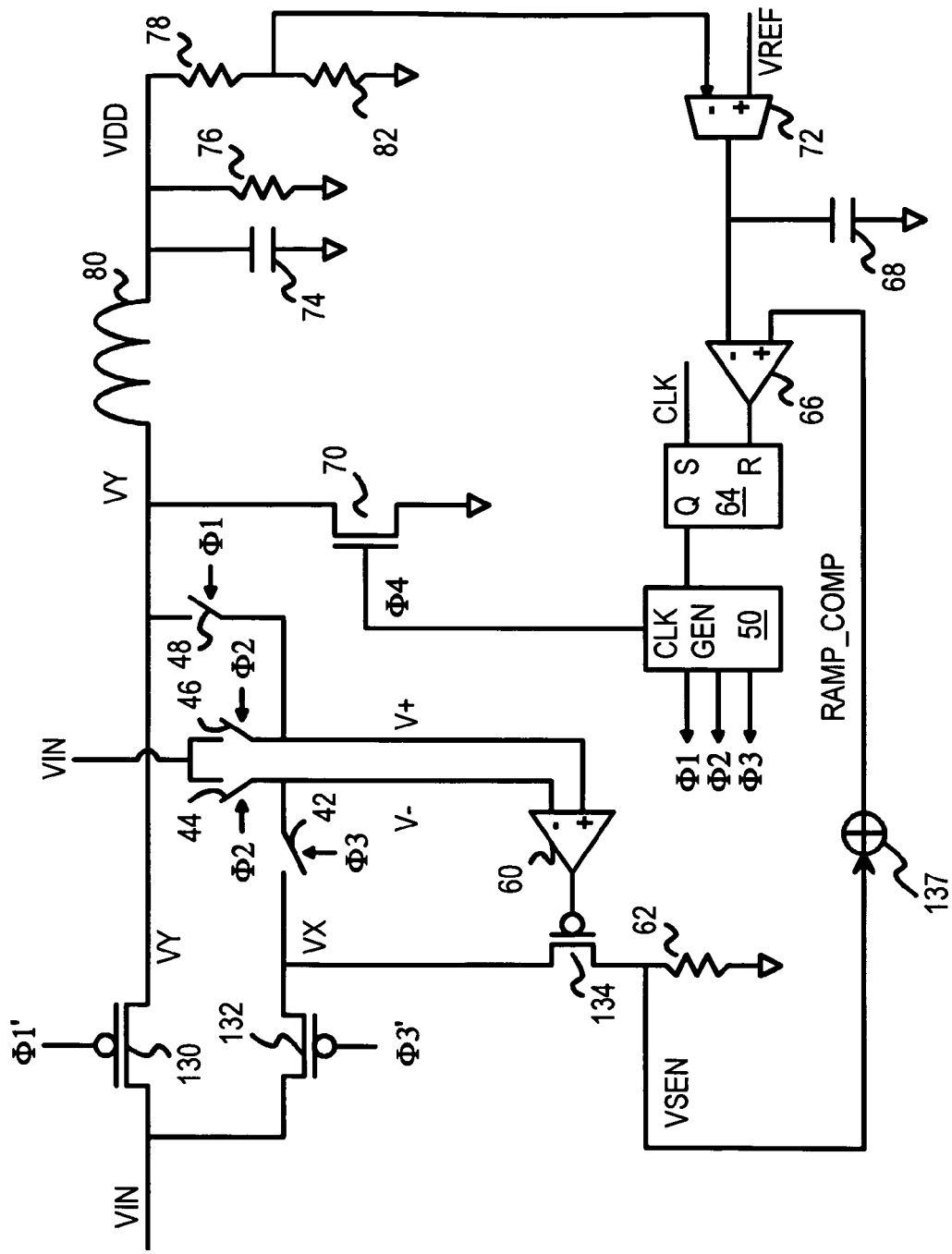
FIG. 1 is a block diagram of a power control circuit.

FIG. 1 is a block diagram of a power control circuit. An input voltage VIN may be an unregulated or a regulated voltage that can provide a high current such as 100 mA, 600 mA, or some other value. Some portable devices may require a much lower current, such as 1 mA, but could still use this power control circuit.

The input voltage VIN is applied to p-channel power transistor 130, which turns on and conducts a power current when φ1 is active (φ1' is low). Power transistor 130 is tuned on during state S1, and the power current passes through inductor 80 and then filtered by power capacitor 74 and resistor 76. Different filter networks may be substituted. A regulated power-supply voltage VDD is obtained on the right side of inductor 80.

The regulated power-supply voltage VDD is divided by resistors 78, 82 to generate a voltage to the inverting input of voltage-sensing amplifier 72, which also receives a reference voltage VREF on its non-inverting input. Voltage-sensing amplifier 72 may be an operational amplifier (op amp) or other kind of amplifier or Operational Transconductance Amplifier (OTA) that generates an error voltage that is the input voltage difference multiplied by a gain. Capacitor 68 smoothes or time-averages the amplified output of voltage-sensing amplifier 72, which is applied to the inverting input of pulse width modulation (PWM) comparator 66.

The non-inverting input of PWM comparator 66 receives a compensated ramp signal RAMP_COMP, which is generated by sensing the power current. Set-reset SR latch 64 is periodically set by clock CLK, and is reset by the output of PWM comparator 66.

Clock generator 50 generates four clock signals φ1, φ2, φ3, φ4 that define two states S1, S2. During state S1, φ1 is active and power transistor 130 is on, driving power current through inductor 80 to VDD. During state S2, φ1 is not active, so power transistor 130 is off, but φ4 is active and n-channel sink transistor 70 is turned on, discharging voltage VY on the node between power transistor 130 and inductor 80. The voltage VY and the current through inductor 80 can be quickly adjusted by alternately turning transistors 130, 70 on and off.

The ratio of times spent in states S1, S2 can be adjusted by the control inputs to SR latch 64. When VDD is too low, such as VDD×R82/(R78+R82) below VREF, voltage-sensing amplifier 72 drives a higher voltage to PWM comparator 66, requiring a longer time for the RAMP_COMP signal to rise high enough to trigger PWM comparator 66 to drive a high signal to the reset input of SR latch 64. The longer time before reset causes SR latch 64 to remain set longer, which keeps state S1 and φ1 active longer. The longer time for state S1 allows power transistor 130 to remain on longer, raising VY and ultimately raising VDD.

In additional to voltage sensing of VDD through voltage-sensing amplifier 72 and PWM comparator 66, current sensing can adjust RAMP_COMP and also adjust VY.

A current sensing circuit is connected to input voltage VIN by p-channel minor transistor 132. P-channel mirror transistor 132 is smaller than power transistor 130, but otherwise minors the current through power transistor 130. For example, p-channel mirror transistor 132 and power transistor 130 can have closely-matched layouts and both have their substrates connected to VIN or to another voltage. The current through p-channel mirror transistor 132 is a fraction of the current through power transistor 130, where the fraction is a ratio predominantly determined by the ratio of sizes (W/L) of transistor 130, 132. Rather than directly measure the current through power transistor 130, which can disturb the power current, the mirrored current through p-channel mirror transistor 132 is sensed by the current sensing circuit.

While power transistor 130 receives φ1' on its gate, p-channel minor transistor 132 receives φ3'. Clock generator 50 delays φ3' relative to φ1' (see timing in FIG. 4) so that power transistor 130 can turn on before p-channel minor transistor 132 turns on. This delayed turn-on of p-channel mirror transistor 132 can prevent a glitch or spike in current through inductor 80 caused by other prior-art current sensors. Power transistor 130 is able to turn on and start charging VY before disturbance by p-channel minor transistor 132. Node VY can settle before sensing disturbances occur. The power current is not disturbed by current sensing due.

The drain of power transistor 130 is voltage VY, while the drain of p-channel mirror transistor 132 is voltage VX. Voltage VX closely mirrors VY through a negative feedback mechanism by amplifier 60 and transistor 134. A sense voltage VSEN is generated from VX when p-channel sensing transistor 134 is turned on by amplifier 60. A voltage divider from VX, through p-channel sensing transistor 134 and sensing resistor 62 to ground produces VSEN as the node between p-channel sensing transistor 134 and sensing resistor 62. Summer 137 can add an offset voltage to VSEN to generate RAMP_COMP of a target voltage for input to PWM comparator 66. RAMP_COMP can be generated by summing two currents: a scaled inductor current from transistor 134, and a ramp current generated from the clock, which is used for ramp compensation. To implement such current summation, the ramp current can be injected to sensing resistor 62. Therefore, the notation of summer 137 is just an illustration for such current summation.

Figure 2:
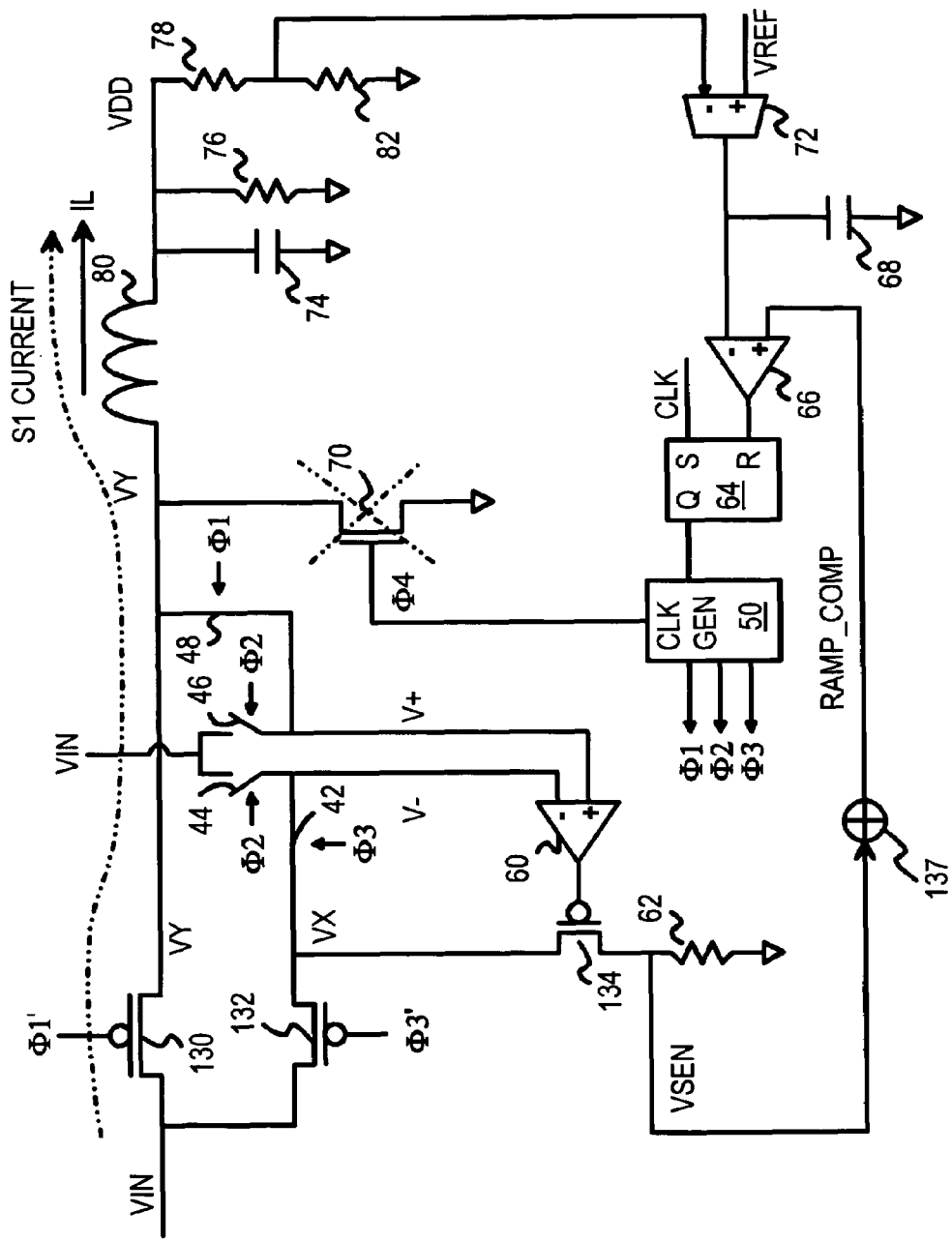
FIG. 2 highlights operation of the current sensing and control circuit during state S1.

FIG. 2 highlights operation of the current sensing and control circuit during state S1. During state S1, clock generator 50 turns on φ1, driving φ1' low and turning on power transistor 130. Power current flows from VIN, through power transistor 130 to VY, and then through inductor 80 as current IL to restore charge on power capacitor 74 and restore VDD. Clock generator 50 keeps φ4 off, so n-channel sink transistor 70 is off.

Clock generator 50 keeps φ2 off, so switches 44, 46 are open. However, φ3 turns on after a delay to allow power transistor 130 to charge VY first, and p-channel minor transistor 132 turns on, allowing VX to rise later. Switches 42, 48 close with φ3 and φ1 becoming active, applying VY to the non-inverting input and VX to the inverting input of amplifier 60.

VY is initially higher than VX, due to the turn on delay between φ1 and φ3. Amplifier 60 initially drives a high to the gate of p-channel sensing transistor 134, keeping it off and allowing p-channel sensing transistor 134 to charge VX higher. Once VX reaches VY, amplifier 60 switches and drives a low onto the gate of p-channel sensing transistor 134, turning it on and allowing VX to discharge through sensing resistor 62. If VX charges below VY, then amplifier 60 again switches to turn off p-channel sensing transistor 134 and allow VX to re-charge through p-channel mirror transistor 132.

VSEN is initially near ground, since p-channel sensing transistor 134 is initially off and sensing resistor 62 connects VSEN to ground. The low VSEN and RAMP_COMP prevent PWM comparator 66 from resetting SR latch 64, so state S1 remains active. After a period of time, VX reaches VY, and p-channel sensing transistor 134 turns on, pulling VSEN up. As VSEN rises in voltage, the filtered signal RAMP_COMP also rises until is rises above the filtered output from voltage-sensing amplifier 72. Then PWM comparator 66 switches its output high, applying a reset to SR latch 64. SR latch 64 resets, causing clock generator 50 to end state S1 and begin state S2. Clock generator 50 turns off φ1 first, opening switch 48 and turning off power transistor 130, thus isolating V+ from disturbance by VY. Then φ3 is deactivated, turning off p-channel mirror transistor 132 and switch 42. VSEN is then discharged during state S2.

Switch 42 is designed to match switch 48, so that any switch resistance or switch offset caused by switch 48 when sensing VY is cancelled by a similar resistance or offset in switch 42 when sensing VX during state S1. During state S2, switches 42, 48 open, but switches 44, 46 close, connecting both inputs of amplifier 60 to the same common-mode voltage, such as VIN.

Figure 3:
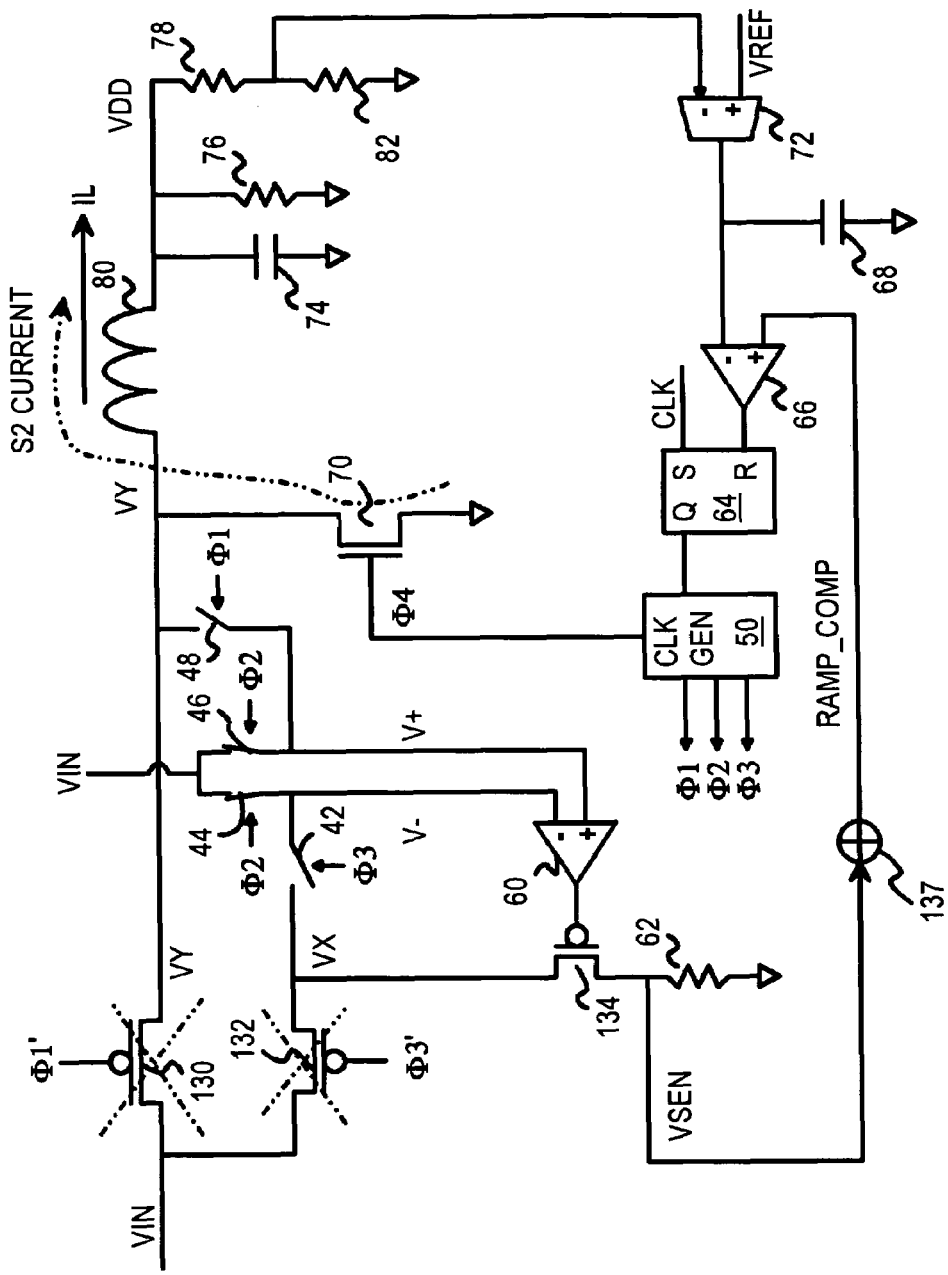
FIG. 3 highlights operation of the current sensing and control circuit during state S2.

FIG. 3 highlights operation of the current sensing and control circuit during state S2. During state S2, clock generator 50 deactivates φ1 and φ3, turning off both power transistor 130 and p-channel minor transistor 132.

Clock generator 50 first turns on φ2, closing switches 44, 46. Both inputs of amplifier 60 are connected to VIN, equalizing any offsets. Amplifier 60 does drive the gate of p-channel sensing transistor 134 high. Since node VX is isolated, p-channel sensing transistor 134 discharges VX to ground until the gate-to-source voltage of p-channel sensing transistor 134 falls below the transistor threshold voltage, and p-channel sensing transistor 134 turns off. Then sensing resistor 62 slowly discharges VSEN to ground.

Since p-channel sensing transistor 134 turns off, there is no D.C. current in the current sensor during state S2. Small currents can be sensed more precisely, and less power is consumed by the current sensor. A small offset voltage can be introduced into amplifier 60 or its inputs to ensure that p-channel sensing transistor 134 turns completely off.

Some time after state S2 begins, after φ2 has been active, clock generator 50 drives φ4 high. the gate of n-channel sink transistor 70 receives φ4 and turns on. The S2 current through n-channel sink transistor 70 reduces the power current IL flowing through inductor 80.

After a period of time, CLK goes high again, setting SR latch 64 and ending state S2. Clock generator 50 turns off φ4 and then φ2. A fast response can occur in the next S1 state, since the gate voltage of p-channel sensing transistor 134 is near VIN, rather than ground. Amplifier 60 only has to change the gate voltage of p-channel sensing transistor 134 a relatively small amount (from VIN), rather than a large amount (from ground).

Figure 4:
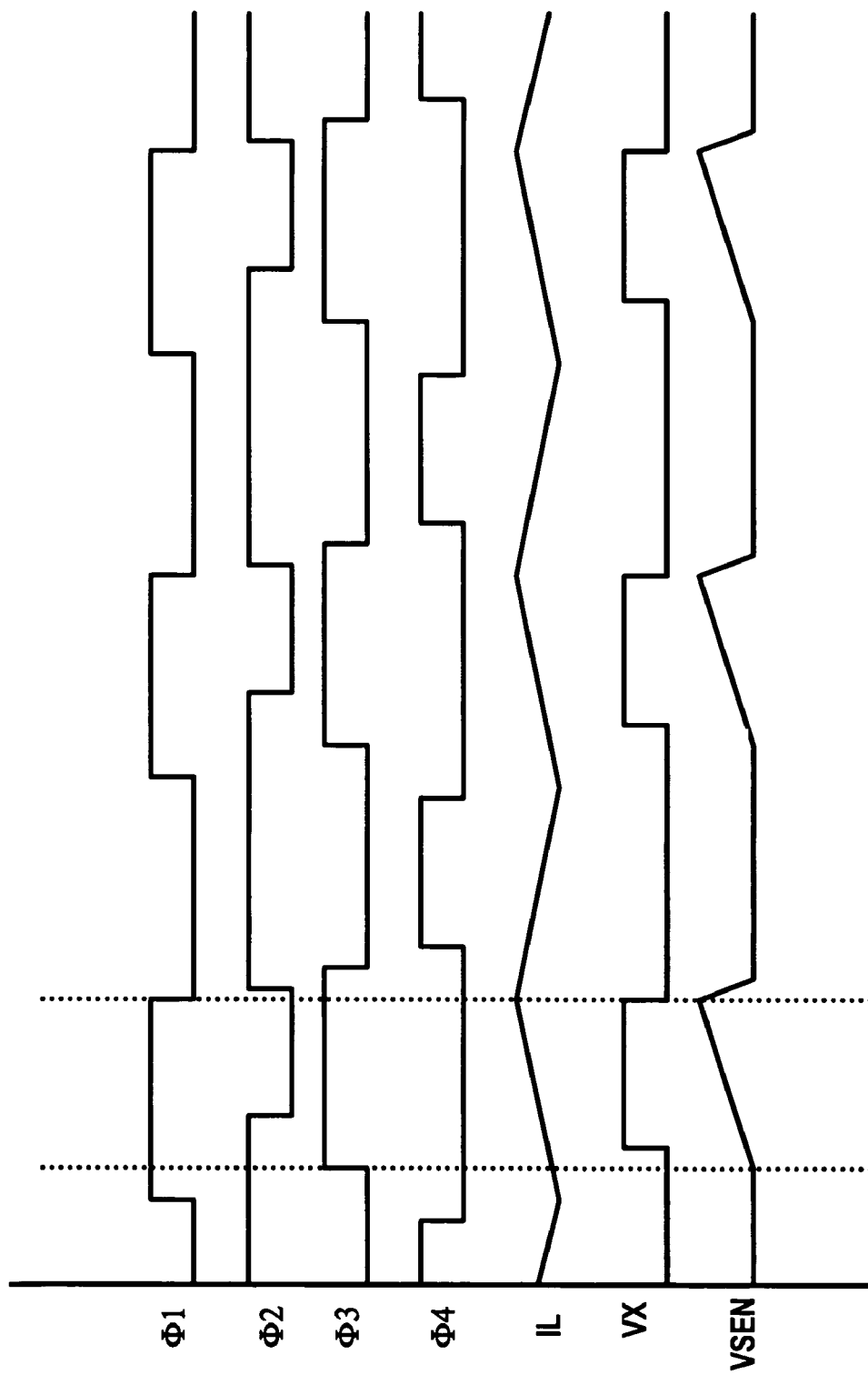
FIG. 4 is a timing diagram of operation of the current sensing and control circuit of FIGS. 1-3.

FIG. 4 is a timing diagram of operation of the current sensing and control circuit of FIGS. 1-3. State S1 begins with clock generator 50 driving φ4 low. After a delay, φ1 is driven high, and φ1' goes low to the gate of power transistor 130. Power current from power transistor 130 flows through inductor 80 and current IL rises as long as φ1 is active.

After another delay, φ3 becomes active, and switches 42, 48 close to connect VX, VY to amplifier 60. P-channel minor transistor 132 turns on to drive VX from VIN. As VX falls, p-channel sensing transistor 134 turns on and VSEN rises slowly. Clock generator 50 drives φ2 low to disconnect the equalizing voltage VIN from the inputs of amplifier 60.

As the power current IL increases, VSEN slowly rises. Eventually VSEN rises above the trigger voltage of PWM comparator 66, and a reset is applied to SR latch 64, ending state S1 and beginning state S2. Clock generator 50 turns off φ1 and then φ3, turning off transistor 130, 132.

In state S2, equalizing switches 44, 46 close as φ2 is driven active. N-channel sink transistor 70 turns on to reduce power current IL as φ4 is pulsed high until the clock sets SR latch 64 and state S2 ends.

Figures 5A, 5B:
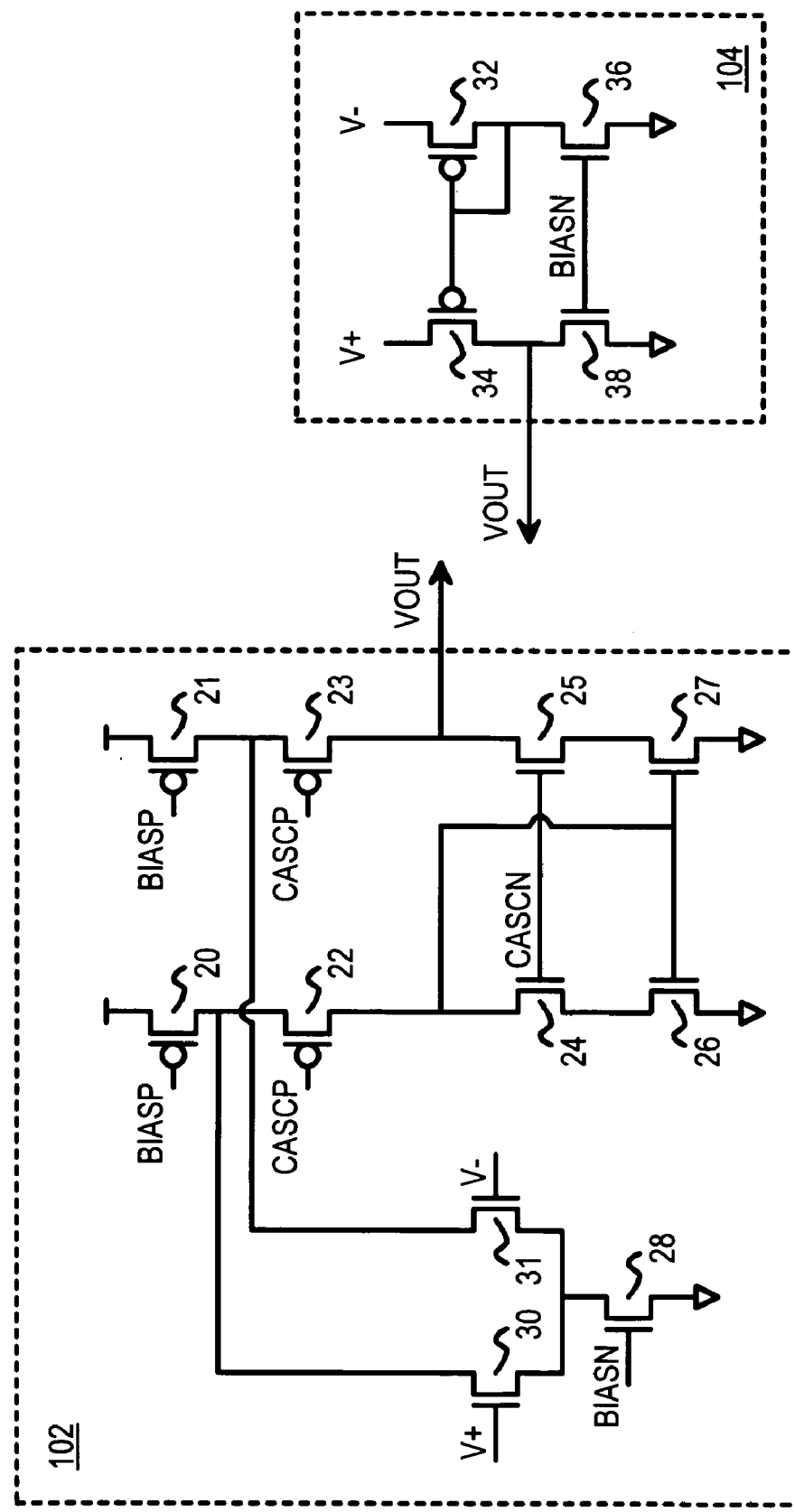
FIG. 5A, 5B show embodiments of a amplifier.

FIG. 5A, 5B show embodiments of an amplifier. Amplifier 60 in FIGS. 1-3, 7-9 can be implements in a variety of ways, such as amplifier 102 of FIG. 5A or amplifier 104 of FIG. 5B.

In FIG. 5A, voltages V+, V− are applied to the gates of differential transistors 30, 31, respectively. Tail n-channel transistor 28 receives a bias voltage BIASN on its gate and sinks current from the sources of n-channel differential transistors 30, 31.

The drain of differential transistor 30 connects to the drain of p-channel source transistor 20 and the source of p-channel cascade transistor 22. The source of n-channel cascade transistor 24 connects to the drain of n-channel source transistor 26. The drains of p-channel cascade transistor 22 and n-channel cascade transistor 24 connect together.

The drain of differential transistor 31 connects to the source of p-channel cascade transistor 23 and the drain of p-channel source transistor 21. The source of n-channel cascade transistor 25 connects to the drain of n-channel source transistor 27. The drains of p-channel cascade transistor 23 and n-channel cascade transistor 25 connect together and drive the output of amplifier 102.

The gates of n-channel source transistors 26, 27 are connected together and to the drains of transistors 22, 24 to minor current. The gates of n-channel cascade transistors 24, 25 are bias voltage CASCN, while the gates of p-channel cascade transistors 22, 23 are bias voltage CASCP. The gates of p-channel source transistors 20, 21 are bias voltage BIASP. The bias voltages can be generated in a conventional way, such as using voltage dividers. Amplifier 102 is an NMOS common-source input folded cascode amplifier.

In FIG. 5B, transistors 32, 34, 36, 38 form a PMOS common-gate input amplifier and function as amplifier 60 of FIG. 1. A bias voltage VBIAS is applied to the gates of n-channel transistors 36, 38 which sink the current from p-channel common-gate transistors 34, 32, respectively.

The gates of p-channel common-gate transistor 34 and p-channel common-gate transistor 32 are connected together and to the drain of p-channel common-gate transistor 32. Voltages V+, V− are applied to the sources of p-channel common-gate transistor 34, 32, respectively. The drains of transistors 34, 38 are the output of the PMOS common-gate input amplifier, or amplifier 104.

Figure 6:
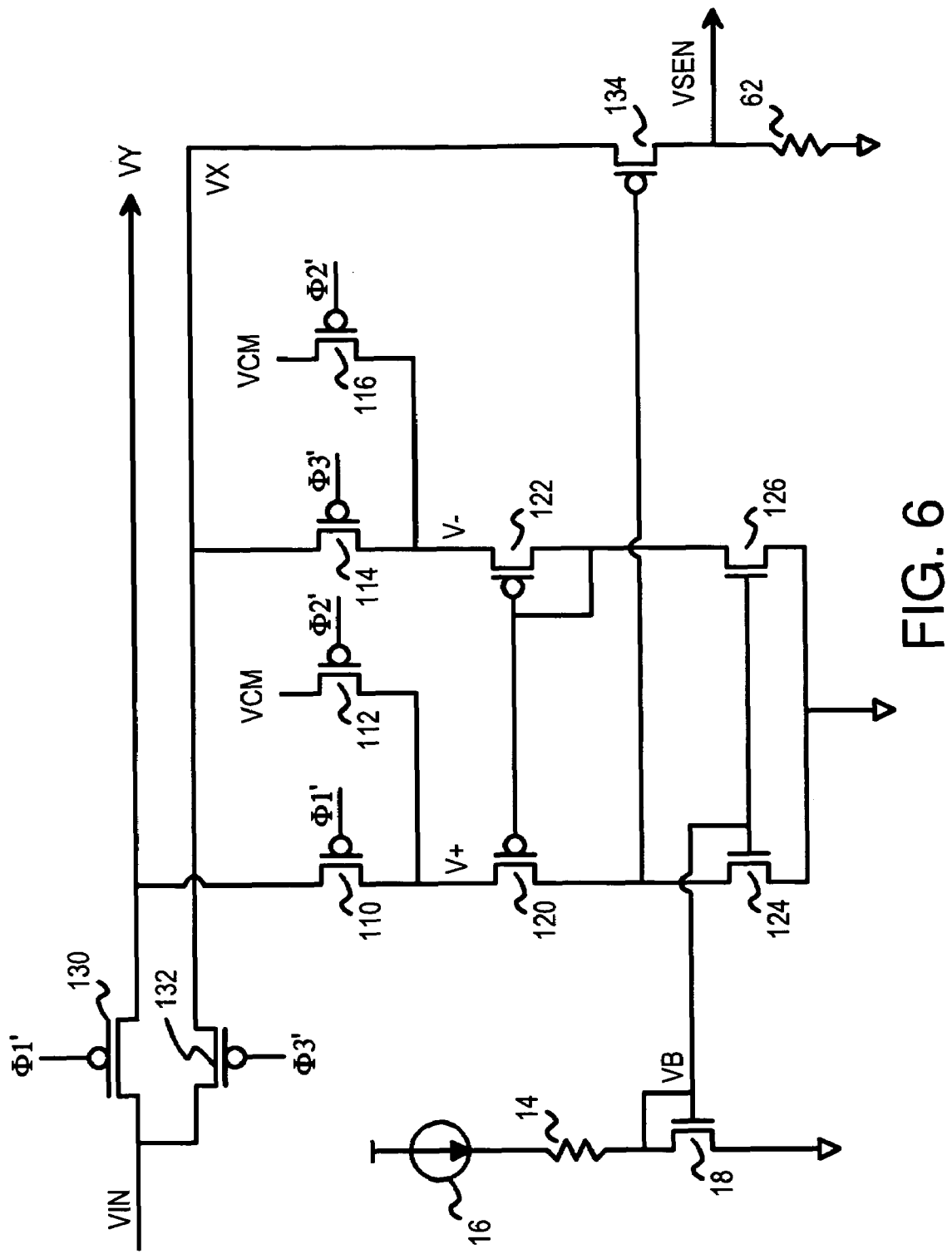
FIG. 6 is a more detailed schematic of the current sensing and control circuit.

FIG. 6 is a more detailed schematic of the current sensing and control circuit. Power transistor 130 connects input voltage VIN to VY and then to inductor 80 (not shown) when φ1' is active-low. During state S1, φ3' is also active low, causing p-channel mirror transistor 132 to minor the power current through power transistor 130. During state S2, n-channel sink transistor 70 (not shown) reduces the power current.

During state S1, p-channel switch transistor 110 connects VY to V+ since it receives φ1' on its gate. After a delay, p-channel switch transistor 114 connects VX to V− since it receives φ3' on its gate. The gates of p-channel common-gate transistor 120 and p-channel common-gate transistor 122 are connected together and to the drain of p-channel common-gate transistor 122. Voltages V+, V− are applied to the sources of p-channel common-gate transistor 120, 122, respectively.

Transistors 120, 122, 124, 126 form a PMOS common-gate input amplifier and function as amplifier 60 of FIG. 1. A bias voltage VB is generated by current source 16, resistor 14, and n-channel bias transistor 18. This bias voltage VB is applied to the gates of n-channel transistors 124, 126, which sink the current from p-channel common-gate transistors 120, 122, respectively.

The drains of transistors 120, 124 are the output of the PMOS common-gate input amplifier and drive the gate of p-channel sensing transistor 134. When p-channel sensing transistor 134 turns on, current from VX passes through p-channel sensing transistor 134 and sensing resistor 62 to generate VSEN.

During state S2, p-channel equalizing switch transistors 112, 116 turn on with φ2; going low. VCM is applied to the PMOS common-gate input amplifier as voltages V+,V− while VX, VY are isolated.

Figure 7:
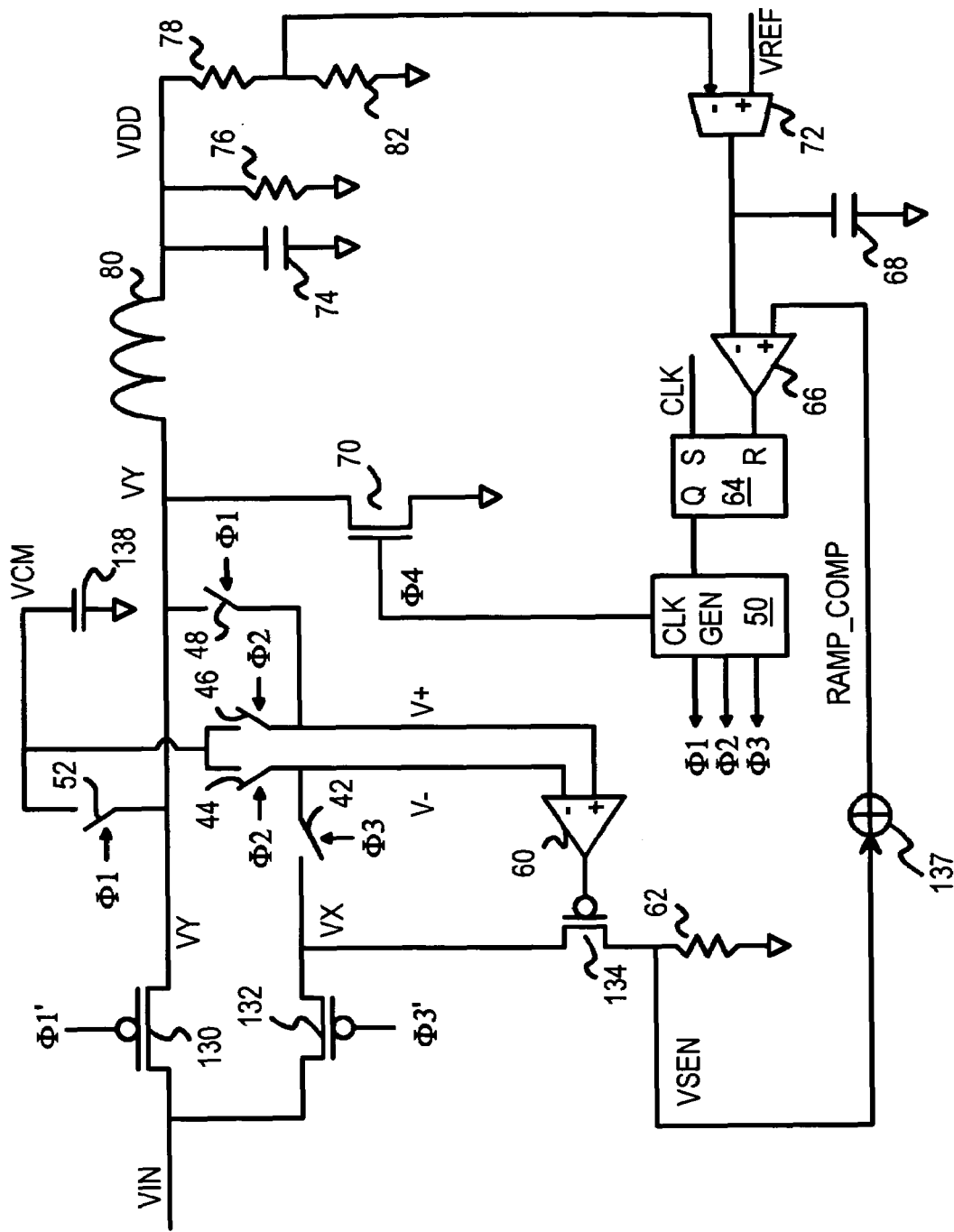
FIG. 7 is an alternate embodiment using a sample-and-hold capacitor for the equalizing voltage.

FIG. 7 is an alternate embodiment using a sample-and-hold capacitor for the equalizing voltage. Rather than apply input voltage VIN through equalizing switches 44, 46 to the inputs of amplifier 60 during state S2, the final voltage of VY is sampled at the end of state S1 and held on common-mode capacitor 138. Sampling switch 52 closes with φ1 to charge common-mode capacitor 138 during state S1. When φ1 falls at the end of state S1, sampling switch 52 opens, holding the charge on common-mode capacitor 138. During state S2, φ2 becomes active, connecting common-mode capacitor 138 to the two inputs of amplifier 60 as common-mode voltage VCM.

Amplifier 60 can drive the gate of p-channel sensing transistor 134 with less of a variation in this embodiment, since VCM is sampled from VY rather than being the higher input voltage VIN.

Figure 8:
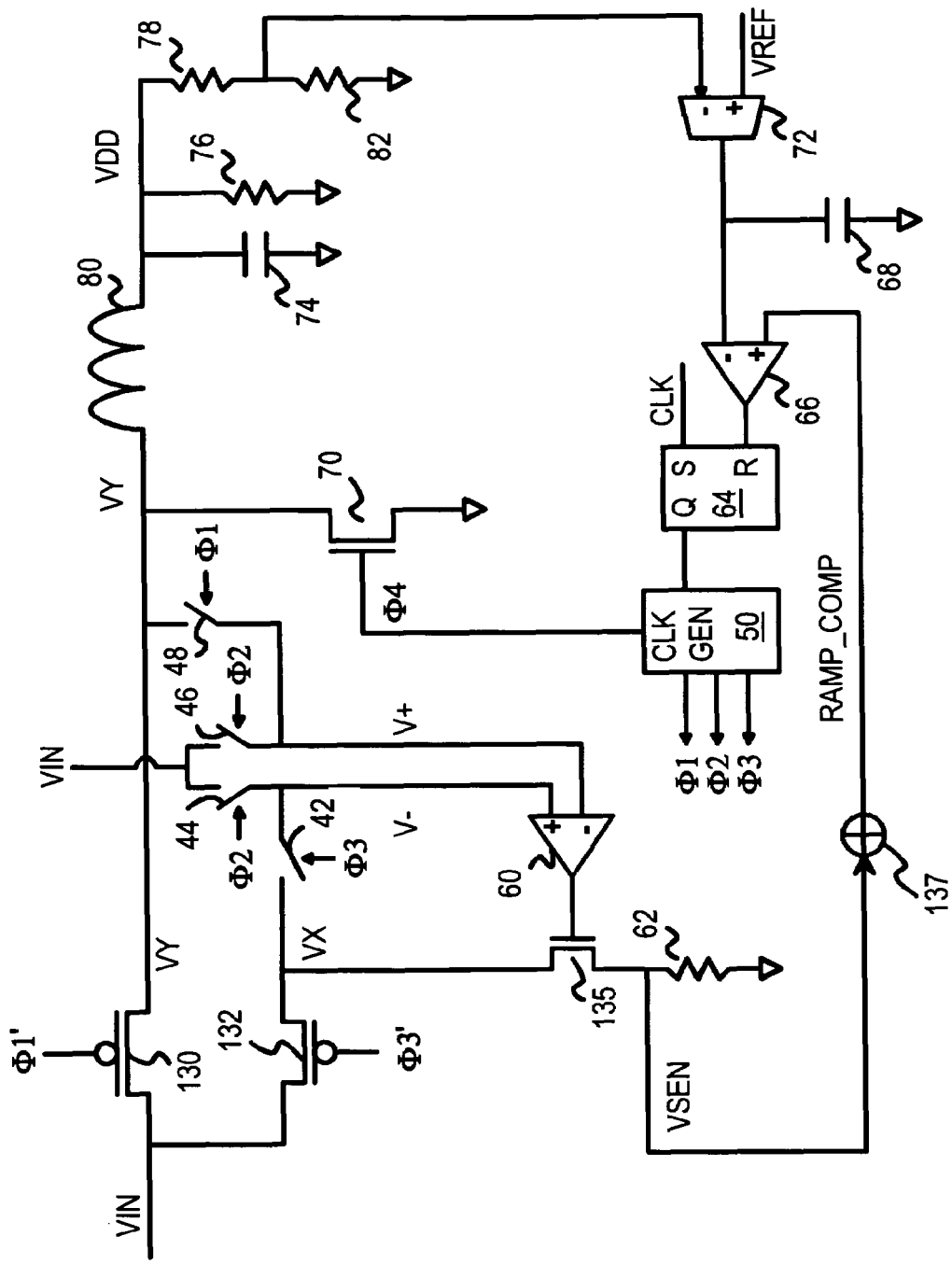
FIG. 8 is an alternate embodiment using an n-channel sensing transistor.

FIG. 8 is an alternate embodiment using an n-channel sensing transistor. Rather than use p-channel sensing transistor 134, n-channel sensing transistor 135 is substituted. The + and − inputs to amplifier 60 are reversed to drive the opposite polarity to the gate of n-channel sensing transistor 135. A negative feedback loop from VX through switch 42 and amplifier 60 to n-channel sensing transistor 135 is used.

Figure 9:
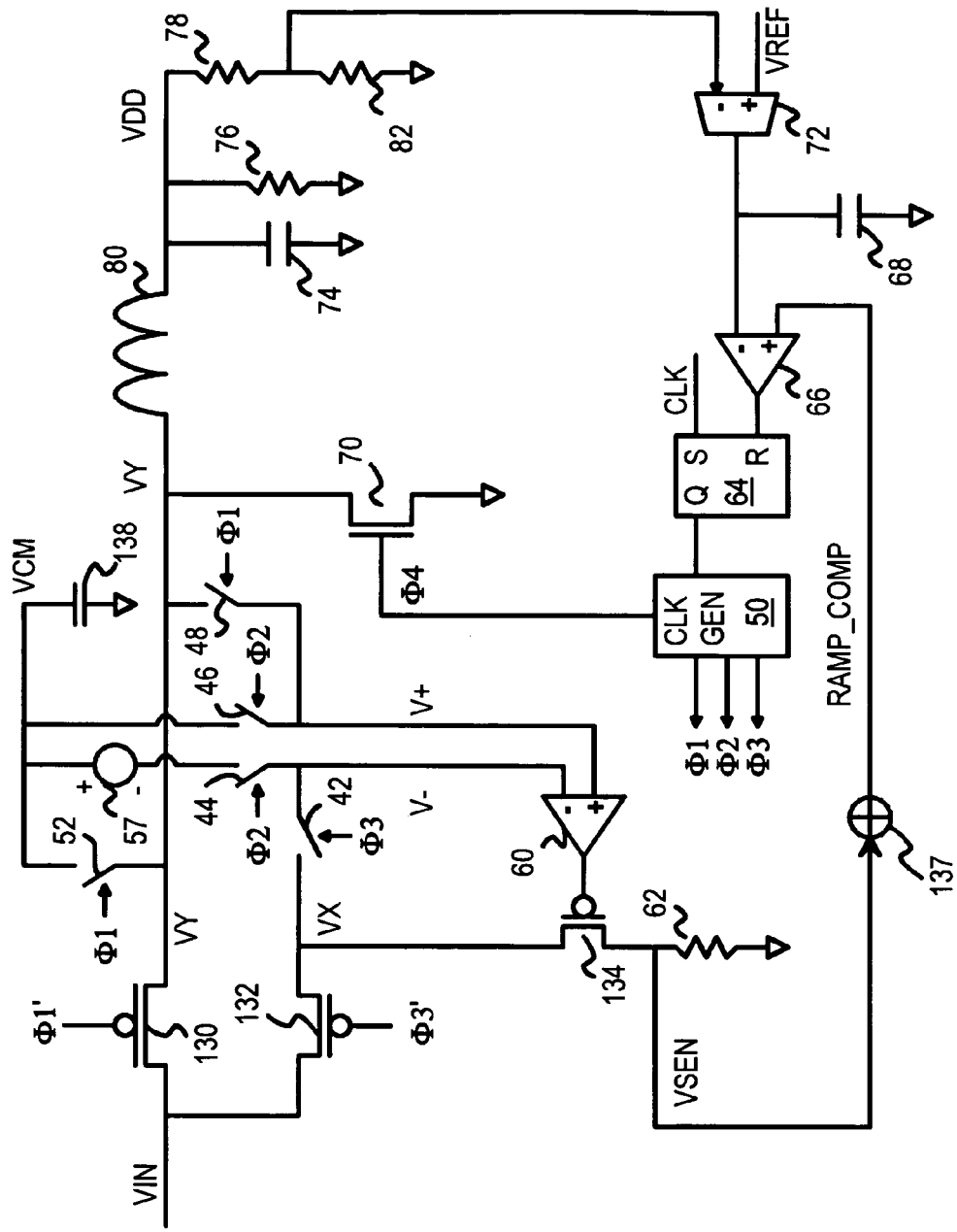
FIG. 9 is an alternate embodiment using an offset to the amplifier.

FIG. 9 is an alternate embodiment using an offset to the amplifier. The final voltage of VY is sampled through sampling switch 52 by common-mode capacitor 138 as described for FIG. 7. However, offset voltage 57 is connected in series between common-mode capacitor 138 and equalizing switch 44, causing this offset voltage to be applied to V− of amplifier 60. Offset voltage 57 can be caused by a mismatch of transistors, such as differential transistors inside amplifier 60 or other components or by a voltage drop through a resistor or by other means.

Offset voltage 57 can turn off p-channel sensing transistor 134 more quickly, improving the response and precision of the circuit for the next cycle.

Simulations show that a spike that occurs when power transistor 130 is turned on can be eliminated. This spike is especially present for prior-art smaller-power-current circuits, such as a power current of 100 mA, but the spike is still present for large power currents, such as 600 mA. The improved circuit of FIGS. 1-4 eliminates this current spike at both small (e.g. 100 mA) and large (e.g. 600 mA) power currents.

Alternate Embodiments

Several other embodiments are contemplated by the inventors. For example, capacitors, resistors, and other filter elements may be added. Switches could be n-channel transistors, p-channel transistors, or transmission gates with parallel n-channel and p-channel transistors. Circuits may be inverted and use n-channel rather than p-channel transistors, and use p-channel rather than n-channel transistors. Wells or substrates under transistors may be connected to a common bias voltage, or each transistor may connect its source and well together. Various combinations may be used.

The reference voltage VREF to voltage-sensing amplifier 72 can be determined by simulation, such as 1.23 volts. Sensing resistor 62 can be 50 K-ohm or some other value. The exact timing shown in FIG. 4 may be changed, and delays to produce non-overlapping clocks may be adjusted or eliminated. Other trigger and compare circuits could be substituted, such as using clock and reset inputs of a D-type flip-flop with the D-input grounded rather than SR latch 64. Other kinds of bi-stable elements could also be substituted. Clock generator 50 can use standard inverters and buffers or logic gates to produce the desired delays and clocks.

Some components may not be present in a real circuit, but are idealized components in the schematics. For example, resistor 76 may represent a load by an actual device that may have thousands of transistors in complex arrangements rather than a single resistor to ground. Components such as summer 137 may be deleted or implemented as part of other circuits, such as shown in FIG. 6.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation.

Inversions may be added, or extra buffering. The final sizes of transistors and capacitors may be selected after circuit simulation or field testing. Metal-mask options or other programmable components may be used to select the final capacitor, resistor, or transistor sizes.

While an operational amplifier (op amp) has been described, other kinds of amplifiers could be used, such as non-amplifying compare buffers. Many circuit types may be used for amplifiers, such as folded cascode, source-followers, differential, etc.

While Complementary-Metal-Oxide-Semiconductor (CMOS) transistors have been described, other transistor technologies and variations may be substituted, and materials other than silicon may be used, such as Galium-Arsinide (GaAs) and other variations.

While positive currents have been described, currents may be negative or positive, as electrons or holes may be considered the carrier in some cases. Charging and discharging may be interchangeable terms when referring to carriers of opposite polarity. Currents may flow in the reverse direction. Clocks may be active in the high state or active in the low state and can be inverted, buffered, or qualified with other signals such as with logic gates.

The generated power supply VDD may be less than 2.0 volts, such as 1.8 volts, 1.5 volts, 1.2 volts, or 1.0 volts, or may be higher values such as 2.6-3.7 volts. The input power voltage VIN may be a volt or so higher, such as 5 volts or 3 volts. Offset voltage 57 may be about equal to the transistor threshold, such as about 0.5 volts, and may vary with conditions rather than be a fixed voltage offset.

The background of the invention section may contain background information about the problem or environment of the invention rather than describe prior art by others. Thus inclusion of material in the background section is not an admission of prior art by the Applicant.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A power-current sensing circuit comprising:

an input having an input voltage;

a power transistor having a gate receiving a first clock, for conducting a power current from the input to a power node when the first clock is active during a first state and for isolating the input from the power node during a second state;

a mirror transistor having a gate receiving a third clock, for conducting current from the input to a mirror node when the third clock is active during the first state and for isolating the input from the mirror node during the second state;

a first switch that connects the power node to a first compare node during the first state and isolates the power node from the first compare node during the second state;

a second switch that connects the mirror node to a second compare node during the first state and isolates the mirror node from the second compare node during the second state;

an amplifier that compares voltages of the first compare node and the second compare node to generate a compare output;

a sensing transistor having a gate receiving the compare output, for conducting a sense current from the mirror node to a sense node; and a bistable that is triggered into the first state by a periodic clock and is triggered into the second state by the sense node, whereby the second switch matches offsets created by the first switch.

2. The power-current sensing circuit of claim 1 further comprising:

a clock generator responsive to the bistable, for generating the first clock and the third clock wherein the third clock is delayed relative to the first clock, wherein the minor transistor turns on with a delay relative to the power transistor turning on, whereby the minor transistor is delayed to reduce disturbance to the power current.

3. The power-current sensing circuit of claim 2 further comprising:

a first equalizing switch, receiving a second clock, for connecting the first compare node to a common-mode voltage during the second state, and for isolating the first compare node from the common-mode voltage during the first state;

a second equalizing switch, receiving the second clock, for connecting the second compare node to the common-mode voltage during the second state, and for isolating the second compare node from the common-mode voltage during the first state;

wherein the clock generator activates the second clock during the second state, whereby inputs to the amplifier are both driven with the common-mode voltage during the second state.

4. The power-current sensing circuit of claim 3 further comprising:
a common-mode capacitor;
a fifth switch, receiving the first clock, for connecting the power node to the common-mode capacitor during the first state to generate the common-mode voltage to the first equalizing switch and the second equalizing switch,
whereby the power node is sampled to generate the common-mode voltage.

5. The power-current sensing circuit of claim 4 further comprising:
an offset voltage applied to the common-mode voltage applied to first compare node to the amplifier and not applied to the second compare node to the amplifier.

6. The power-current sensing circuit of claim 3 further comprising:
a power sink transistor, having a gate receiving a fourth clock, for conducting current from the power node when the fourth clock is active during the second state;
wherein the clock generator activates the fourth clock during the second state.

7. The power-current sensing circuit of claim 6 further comprising:
an inductor coupled between the power node and a power-supply node;
a power capacitor coupled to the power-supply node,
wherein the power-supply node is regulated by the power-current sensing circuit.

8. The power-current sensing circuit of claim 7 further comprising:
a voltage divider coupled to the power-supply node that generates a voltage-sensed voltage;
a second amplifier that compares the voltage-sensed voltage to a reference voltage to generate a voltage trigger;
a comparator that receives the voltage trigger and the sense node to generate a reset signal to the bistable,
whereby both a voltage-sensed trigger from the power-supply node and a current-sensed trigger are combined to trigger the bistable.

9. The power-current sensing circuit of claim 3 wherein the first switch receives the first clock;
wherein the second switch received the third clock.

10. The power-current sensing circuit of claim 3 further comprising:
a sensing resistor coupled between the sense node and a fixed voltage, for generating a current-sensing voltage on the sense node.

11. The power-current sensing circuit of claim 6 wherein the power transistor, the minor transistor, the first switch, the second switch, the first equalizing switch, and the second equalizing switch are p-channel transistors and the power sink transistor is a n-channel transistor coupled to ground.

12. The power-current sensing circuit of claim 11 wherein the sensing transistor is a p-channel transistor, wherein the first clock and the fourth clock are non-overlapping clocks.

13. A current-sensing circuit comprising:
an input;
a power transistor having a gate driven by a first clock and a channel between the input and a power node;
a mirror transistor having a gate driven by a delayed first clock and a channel between the input and a mirror node;
a first switch transistor having a gate driven by the first clock and a channel between the power node and a first compare node;
a second switch transistor having a gate driven by the delayed first clock and a channel between the minor node and a second compare node;
a third switch transistor having a gate driven by a second clock and a channel between a common-mode node and the first compare node;
a fourth switch transistor having a gate driven by the second clock and a channel between the common-mode node and the second compare node;
a sink transistor having a gate driven by a fourth clock and a channel between the power node and a sink node;
a clock generator that drives the first clock active and the second and fourth clocks inactive during a first state, and drives the first clock inactive and the second and fourth clocks active during a second state;
wherein the power transistor conducts a power current during the first state and is off during the second state;
wherein the sink transistor conducts a sink current during the second state and is off during the first state;
an amplifier that receives the first compare node and the second compare node and drives a compare output;
a sensing transistor having a gate that receives the compare output and a channel between the mirror node and a sense node;
a sense resistor between the sense node and the sink node;
wherein the sense node generates a trigger to the clock generator causes the clock generator to transition from the first state to the second state,
whereby current through the minor transistor is sensed to toggle from the first state to the second state to control the power current.

14. The current-sensing circuit of claim 13 further comprising:
an inductor coupled between the power node and a regulated node, the inductor receiving the power current from the power transistor;
a voltage sensor on the regulated node, the voltage sensor adjusting a trigger level of the clock generator,
whereby both voltage sensing of the regulated node and current sensing control the power transistor.

15. The current-sensing circuit of claim 14 further comprising:
a bistable in the clock generator, the bistable being triggered into the second state by the sense node crossing a voltage of the trigger level from the voltage sensor;
wherein the bistable is reset by a clock.

16. The current-sensing circuit of claim 15 further comprising:
a smoothing capacitor, coupled to the voltage sensor, for smoothing variations in the trigger level.

17. The current-sensing circuit of claim 13 wherein the amplifier comprises:
a first common-gate transistor having a gate connected to a gate node and a channel between the first compare node and the compare output;

a second common-gate transistor having a gate connected to the gate node and a channel between the second compare node and the gate node;

a first tail transistor having a gate driven by a bias voltage and a channel between the compare output and the sink node; and a second tail transistor having a gate driven by the bias voltage and a channel between the gate node and the sink node.

18. The current-sensing circuit of claim 17 wherein the first common-gate transistor and the second common-gate transistor are p-channel transistors;

wherein the sensing transistor is a p-channel transistor;

wherein the first tail transistor and the second tail transistor are n-channel transistors and the sink node is a ground;

wherein the power transistor, the minor transistor, the first switch transistor, the second switch transistor, the third switch transistor, and the fourth switch transistor are p-channel transistors.

19. A power controller comprising:

an input having an input voltage;

power transistor means, having a gate receiving a first clock, for conducting a power current from the input to a power node when the first clock is active during a first state and for isolating the input from the power node during a second state;

minor transistor means, having a gate receiving a third clock, for conducting current from the input to a minor node when the third clock is active during the first state and for isolating the input from the minor node during the second state;

first switch means for connecting the power node to a first compare node during the first state and for isolating the power node from the first compare node during the second state;

second switch means for connecting the minor node to a second compare node during the first state and for isolating the minor node from the second compare node during the second state;

first equalizing switch means, receiving a second clock, for connecting the first compare node to a common-mode voltage during the second state, and for isolating the first compare node from the common-mode voltage during the first state;

second equalizing switch means, receiving the second clock, for connecting the second compare node to the common-mode voltage during the second state, and for isolating the second compare node from the common-mode voltage during the first state;

amplifier means for comparing voltages of the first compare node and the second compare node to generate a compare output;

sensing transistor means, having a gate receiving the compare output, for conducting a sense current from the minor node to a sense node;

bistable means for being triggered into the first state by a periodic clock and for being triggered into the second state by the sense node;

clock generator means, responsive to the bistable means, for activating the first clock and the third clock in response to the second state, and for activating the second clock and a fourth clock in response to the first state, wherein the third clock is delayed relative to the first clock, wherein the mirror transistor means turns on with a delay relative to the power transistor means turning on;

power sink transistor means, having a gate receiving the fourth clock, for conducting current from the power node when the fourth clock is active during the second state;

wherein the clock generator means activates the fourth clock during the second state.

20. The power controller of claim 19 further comprising:

inductor means coupled between the power node and a regulated node for controlling current to the regulated node;

a power capacitor coupled to the regulated node;

voltage divider means, coupled to the regulated node, for generating a voltage-sensed voltage;

second amplifier means for comparing the voltage-sensed voltage to a reference voltage to generate a voltage trigger;

comparator means for comparing the voltage trigger to the sense node to generate a reset signal to the bistable means, whereby both a voltage-sensed trigger from the regulated node and a current-sensed trigger are combined to trigger the bistable means.

* * * * *